(12) United States Patent
Halliyal et al.

(10) Patent No.: US 6,593,748 B1
(45) Date of Patent: Jul. 15, 2003

(54) PROCESS INTEGRATION OF ELECTRICAL THICKNESS MEASUREMENT OF GATE OXIDE AND TUNNEL OXIDES BY CORONA DISCHARGE TECHNIQUE

(75) Inventors: Arvind Halliyal, Sunnyvale, CA (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/904,367

(22) Filed: Jul. 12, 2001

(51) Int. Cl.[7] ............................................. G01R 31/26
(52) U.S. Cl. ...................... 324/455; 324/750; 324/766; 427/460
(58) Field of Search ................ 438/14, 798; 250/492.2; 324/765, 750, 759, 760, 455, 766, 702; 427/352, 355, 460

(56) References Cited

U.S. PATENT DOCUMENTS

| 5,485,091 | A | | 1/1996 | Verkuil ........................ 324/455 |
| 6,097,196 | A | * | 8/2000 | Verkuil et al. ............. 250/492.2 |
| 6,124,725 | A | * | 9/2000 | Sato ............................ 324/765 |
| 6,136,669 | A | * | 10/2000 | Flitsch et al. ................ 324/765 |
| 6,287,990 | B1 | * | 9/2001 | Cheung et al. .......... 427/249.15 |

OTHER PUBLICATIONS

KLA–Tencor–Products–Charge Contaimination Measurement–Quantox, Copyright, 2001,Jul. 2000, KLA–Tencor Corporation, taken from the Internet at http://www.kla–tencor.com/products/semicon process para ctrl/charge contam measurem . . . .

"Diagnosing Processing Problems Through Electrical Charge Characterization", Greg Horner and Brian Letherer, Yield Management Solutions, Autumn, 1999, pp 26–28.

"Advanced in Thin Film Measurement", Ruth Dejule, Semiconductor International, May, 1998, 7 pages.

"Ramping the 0.13 um Generation", Laura Peters, Semiconductor International, Jan., 2001, ten pages.

"Replacing C–V Monitoring With Noncontact COS Charge Analysis", K.B. Catmull, R.G. Cosway, B.A. Letherer and G. S. Horner, Semiconductor International, Jun, 1998, six pages.

"Process Module Control for Advanced Gate Dielectrics", Clive Hayzelden, Patrick Stevens, David McCain and Daniel Iversen, Semiconductor International, Jul., 2000, seven pages.

"Silicon Processing for the VLSI Era: Process Technology, Second Edition, vol. 1." S. Wolf and R. N. Tauber, Lattice Press, 2000, pp. 314–318, No month available.

* cited by examiner

Primary Examiner—Jay Patidar
Assistant Examiner—Vincent Q. Nguyen
(74) Attorney, Agent, or Firm—Eschweiler & Associates LLC (57) ABSTRACT

The present invention relates to a system for controlling a thin film formation process using a corona discharge measurement technique. The system includes a thin film formation system operative to form a thin film based on one or more process parameters, a corona discharge measurement system operable to measure one or more properties of the thin film, and a processor operatively coupled to the thin film formation system and the corona discharge measurement system, wherein the processor analyzes the data from the corona discharge measurement system and a set of target data and controls the one or more process parameters via the thin film formation system based on the analysis. The present invention also relates to a method for controlling a thin film formation using a corona discharge technique. The method includes forming a thin film based on one or more thin film formation process parameters, measuring the thin film via a corona discharge technique, analyzing the results of the corona discharge measurement, and controlling the one or more thin film formation process parameters based on the analysis.

49 Claims, 6 Drawing Sheets

PROCESS INTEGRATION OF ELECTRICAL THICKNESS MEASUREMENT OF GATE OXIDE AND TUNNEL OXIDES BY CORONA DISCHARGE TECHNIQUE

TECHNICAL FIELD OF INVENTION

The present invention relates to a system and a method of manufacturing integrated circuits on semiconductor substrates. More specifically, the present invention relates to a system and manufacturing method which improves control of electrical thickness and interface charge density of insulating thin films.

BACKGROUND OF THE INVENTION

In the semiconductor industry, there is a continuing trend toward manufacturing integrated circuits with a greater number of layers and with higher device densities. To achieve these high densities there have been, and continue to be, efforts towards reducing the thickness of layers, improving the uniformity of layers, reducing the thickness of devices and scaling down device dimensions (e.g., at sub micron levels) on semiconductor wafers. In order to accomplish higher device packing densities, thinner layers, more uniform layers, smaller feature sizes, and smaller separations between features are required. This can include the thickness of gate oxide materials, (e.g., silicon oxide, silicon nitride, silicon oxynitride, metal oxides and high K materials such as $ZrO_2$ and $HfO_2$ and metal silicates of Hf, Zr, La, etc.), interconnecting lines, spacing and diameter of contact holes, and the surface geometry such as corners and edges of various features.

The process of manufacturing semiconductors, or integrated circuits (commonly called ICs, or chips), typically consists of more than a hundred steps, during which hundreds of copies of an integrated circuit can be formed on a single wafer. Generally, the process involves creating several layers on and in a substrate that ultimately forms the complete integrated circuit. This layering process can create electrically active regions in and on the semiconductor wafer surface. Insulation and conductivity between such electrically active regions can be important to reliable operation of such integrated circuits. Thus, controlling the width, thickness and/or uniformity of layers created during the layering process can be important to the reliable operation of such integrated circuits. Insulation and conductivity between electrically active regions is important in MOSFET (Metal Oxide Semiconductor Field Effect Transistor) semiconductor devices.

Figure 1:
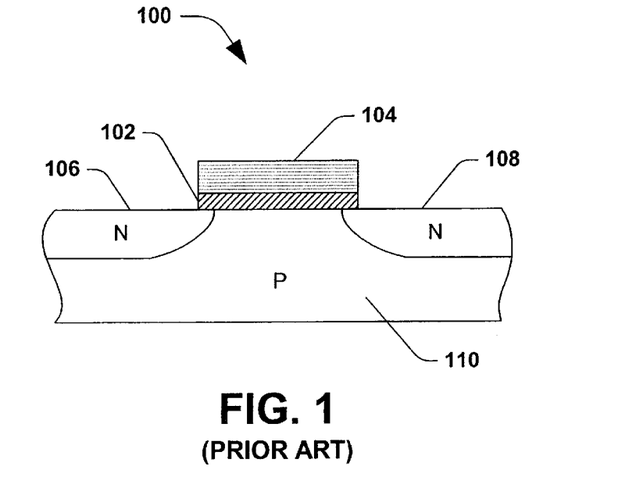
FIG. 1 is a diagram illustrating a typical MOSFET device.

An exemplary MOSFET device 100 is illustrated in Prior Art. FIG. 1. The exemplary MOSFET device 100 illustrated includes a gate 104 separated from a substrate 110 by a gate oxide 102. The MOSFET includes a source 106 and a drain 108. The thickness of the gate oxide 102 can be important to reliable operation of the MOSFET 100, and thus, manufacturing the gate oxide 102 to precise measurements facilitates increasing MOSFET reliability.

The gate oxide layer 102 functions as an insulating layer. The gate oxide layer 102 can be the smallest feature of a device. Reducing the thickness of the gate oxide layer 102 can contribute to increasing the switching speed of a transistor. But reducing the thickness of the gate oxide layer 102 can lead to problems associated with breakdown and reliability of gate oxides. Thus, precisely monitoring and controlling properties of the gate oxide layer 102 including, but not limited to, thickness and uniformity, are important to facilitating reliable operation of the MOSFET 100. For example, the ability to store data, to retain data, to be erased, to be reprogrammed and to operate in desired electrical and temperature ranges can be affected by the thickness and/or uniformity of the gate oxide layer 102.

In stacked gate oxide films, the gate oxide is comprised of at least two layers but it is to be appreciated that it may be formed from two, three or more layers. The gate oxide is a very thin film, and thus precisely and uniformly forming sublayers having even smaller thickness than the gate oxide film is extremely difficult. The requirement of small features with close spacing between adjacent features in MOSFET devices requires sophisticated manufacturing techniques including precise control of gate oxide layer formation. Furthermore, precise control of layers employed in fabricating stacked gate oxides similarly requires precise control. Fabricating a MOSFET device using such sophisticated techniques may involve a series of steps including the formation of layers/structures by chemical vapor deposition (CVD), rapid thermal oxidation, metal organic CVD (MOCVD), atomic layer CVD (ALCVD), pulsed laser deposition (PLD), thermal oxide growth and other deposition processes. Difficulties in forming a gate oxide layer with precise thickness and/or uniformity have limited the effectiveness and/or properties of MOSFET devices manufactured by conventional techniques.

Measurement of the gate oxide is crucial to maintaining precision and/or uniformity of MOSFET devices. One method of measuring the gate oxide utilizes a corona discharge technique. A corona discharge technique is, a contactless electrical technique for measuring insulating layer thickness of oxides, nitrides, stacks of oxides and/or nitrides, or any other dielectric less than about 300 Å on a semiconductor substrate. Further, corona discharge is a capacitance-voltage technique for measuring insulating layer thickness on a semiconductor substrate that corrects for the presence of non-zero accumulation bandbending effects (accumulation capacitance) in the substrate, and wherein the need is reduced to bias the oxide-silicon structure strongly into accumulation. A further feature of a corona discharge technique is to provide a measure of the interface charge density of insulating layers on semiconductor substrates, with the insulating layers having thicknesses as low as 10–20 Å, as well as providing a measure of contaminants in the insulating layers.

Figure 2:
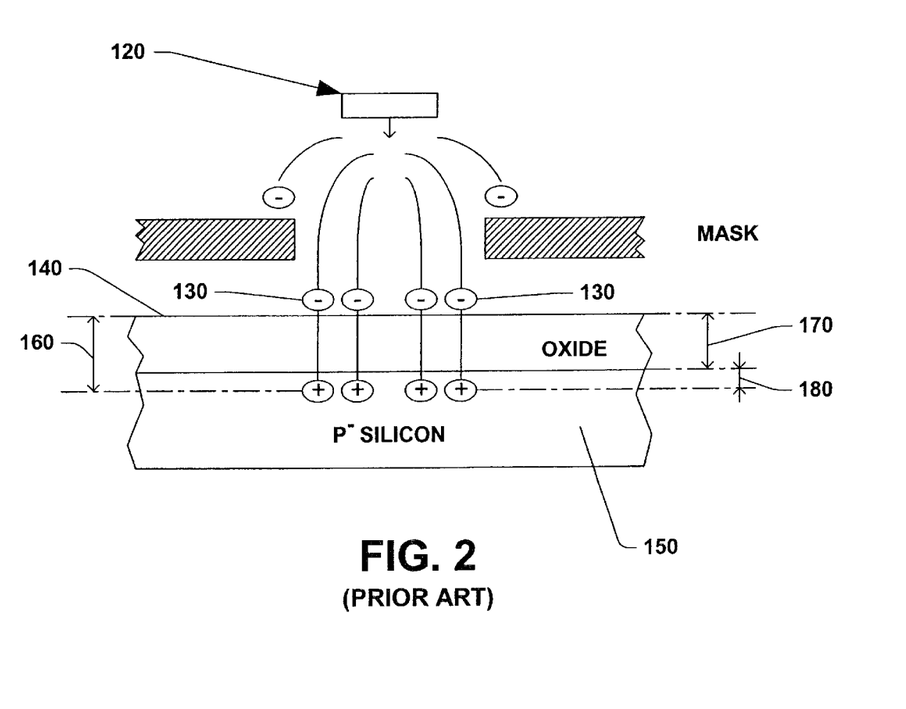
FIG. 2 is a diagram illustrating a prior art corona discharge measurement device.

An exemplary apparatus for making accurate thickness and interface charge density measurements on insulating layers using a corona discharge technique is illustrated in FIG. 2. According to one exemplary corona discharge measurement, a corona discharge source 120 repetitively deposits a calibrated fixed charge density 130 on a surface of a thin oxide layer 140 residing on or over a silicon substrate 150. The resultant change in oxide surface potential 160 for each charge deposition 130 is measured, for example, with a vibrating probe. The change in oxide surface potential 160 is due to the sum of the change in voltage across the oxide layer 170 plus the change in silicon bandbending 180 due to the presence of non-infinite accumulation capacitance in said substrate. The change in oxide surface potential 160 can be utilized to determine electrical thickness ($T_{ox}$), interface charge density ($D_{it}$), total oxide charge ($Q_{tot}$), flat band voltage ($V_{fb}$), onset of oxide tunneling ($E_{tunnel}$), and various other parameters as will be known by one of ordinary skill in the art.

Due to the extremely fine structures that are fabricated on a MOSFET device, controlling the electrical thickness and other parameters of gate oxide layers employed to form a stacked gate oxide are significant factors in achieving desired critical dimensions and operating properties and thus in manufacturing a reliable MOSFET device. The more precisely the gate oxide can be formed, the more precisely critical dimensions may be achieved, with a corresponding increase in MOSFET device reliability. Conventionally, due to non-uniform and uncontrolled gate oxide layer formation and inaccurate gate oxide layer formation monitoring techniques, a thickness of gate oxide may be formed greater or lesser than the thickness desired.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its primary purpose is to present some concepts of the invention in a simplified form as a prelude to the more detailed description that is presented later.

The present invention relates generally to a corona discharge measurement technique which measures dielectric electrical thickness and associated dielectric-silicon interface charge density of a thin film (e.g., on the order of 200 Å or less) to control a process of forming the thin film on a substrate.

According to one exemplary aspect of the present invention, a corona discharge measurement technique generally comprises a corona discharge source repetitively depositing a calibrated fixed charge density on the surface of the dielectric. The resultant change in dielectric surface potential for each charge deposition is measured. The resultant change in dielectric surface potential can then be processed to determine the dielectric electrical thickness ($T_{ox}$) value being sought. The corona discharge measurement can also be used to determine the interface charge density ($D_{it}$), total oxide charge ($Q_{tot}$), flat band voltage ($V_{fb}$), onset of oxide tunneling ($E_{tunnel}$), and various other parameters of the thin film which are also valuable in determining acceptability of the thin film.

The present invention is directed to a system that facilitates control of a thin film formation process involved in semiconductor manufacturing. By utilizing a corona discharge technique for measuring a thin film (e.g., oxide, nitride) formed on a silicon substrate, measured thin film data is fed back to control the formation process. By controlling the thin film formation process with the use of thin film measurement feedback via a corona discharge technique, superior electrical thickness control can be achieved, thereby facilitating the desired performance and functionality of semiconductor devices which comprise the thin film.

An exemplary system may employ one or more process parameters (e.g., temperature, pressure) which govern the formation of the thin film. A thin film formation system is arranged to control the one or more process parameters utilized in the formation of the dielectric thin film on the substrate. A corona discharge measurement system is implemented to measure the thin film formed on the substrate, thereby defining measured thin film data (e.g., electrical thickness, interface charge density). A processor, operatively coupled to the thin film formation system and the corona discharge measurement system, determines whether the one or more process parameters require adjustment based on an analysis of the measured thin film data and target thin film data. A trained neural network, for example, is employed to determine an appropriate adjustment to the one or more process parameters. The adjustment of the one or more process parameters is further implemented by the thin film formation system via feedback from the processor, such that subsequent thin films may be formed utilizing the adjustment.

The present invention is also directed to a method for controlling a thin film formation process utilizing a corona discharge measurement technique. An exemplary method comprises forming a thin film on a substrate based on one or more thin film formation process parameters (e.g., temperature, pressure). The thin film is measured using a corona discharge measurement technique, thereby defining measured thin film data. The measured thin film data and a target thin film data set are analyzed via a processor, and an adjustment to the one or more thin film formation process parameters is determined. The adjustment to the one or more thin film formation process parameters is subsequently performed via the thin film formation system.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. In other instances, well-known structures and devices are shown in block diagram form in order to facilitate description of the present invention.

Figure 3:
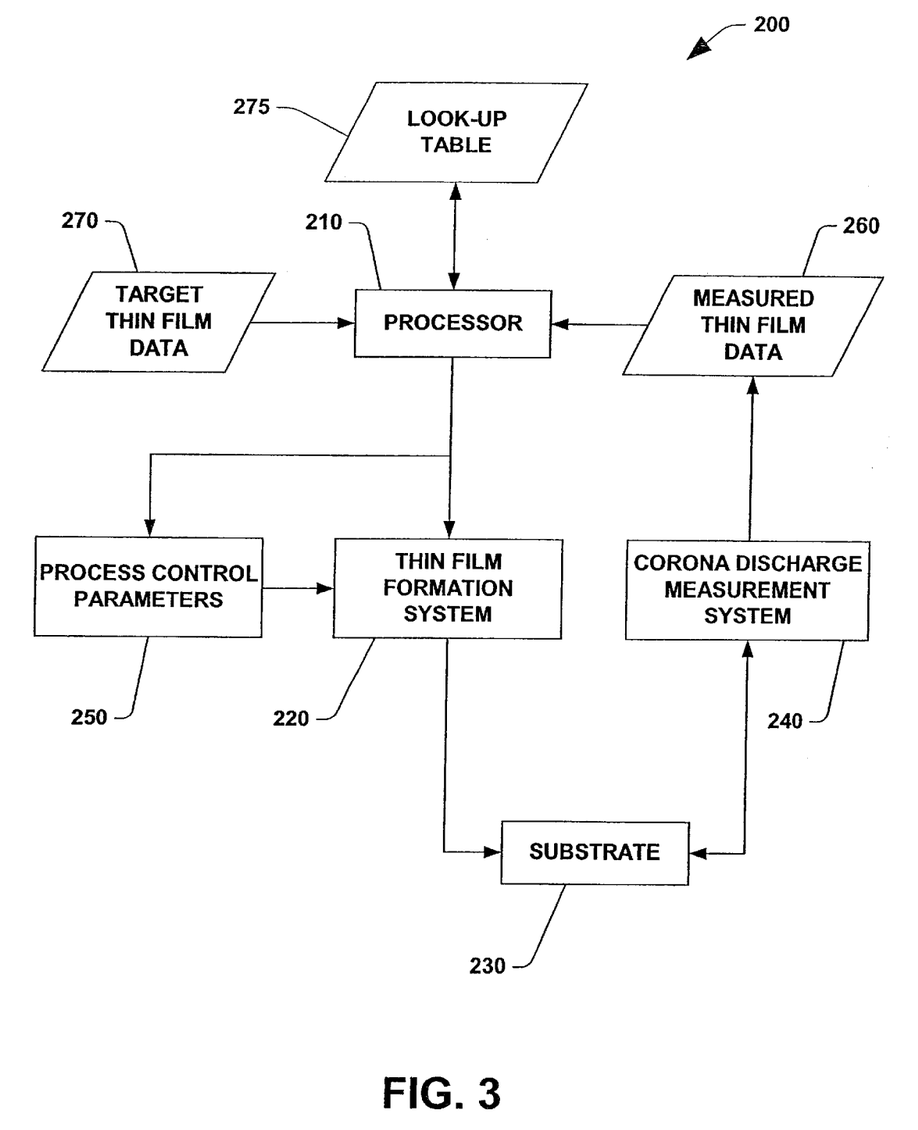
FIG. 3 is a diagram illustrating an exemplary system employing a corona discharge measurement system with feedback process control according to the present invention.

The present invention is directed to a system for controlling a thin film formation process on a substrate (e.g., a semiconductor substrate) using a corona discharge technique. The system is configured to measure the thin film formed on the substrate via a corona discharge, thereby defining measured thin film data, and further to feed the measured thin film data back to a processor in order to control the thin film formation process. An exemplary system 200 is illustrated in FIG. 3, wherein a processor 210 is operably coupled to a thin film formation system 220 and a corona discharge measurement system 240. The thin film formation system 220 (e.g., chemical vapor deposition (CVD), rapid thermal oxidation, metal organic CVD (MOCVD), atomic layer CVD (ALCVD), pulsed laser deposition (PLD), thermal oxide growth or other deposition system) is operable to control the formation of a thin film such as, for example, an oxide, nitride, metal oxide, silicate, or aluminate on a silicon substrate 230 by controlling one or more process parameters 250 such as, for example, temperature, pressure, gas flow rate, and thin film formation time.

The corona discharge measurement system 240 is operable to measure the thin film formed on the substrate 230, thereby defining measured thin film data 260 (e.g., electrical thickness ($T_{ox}$), interface charge density ($D_{it}$), total oxide charge ($Q_{tot}$), flat band voltage ($V_{fb}$), onset of oxide tunneling ($E_{tunnel}$)). For example, a suitable corona discharge measurement system 240 such as the Quantox® system manufactured by Keithley Instruments, Inc. or another commercially-available corona discharge measurement system can be utilized to measure the thin film in accordance with the present invention.

The processor 210 is operable to receive the measured thin film data 260 from the corona discharge measurement system 240, and to control the one or more process parameters 250 via the thin film formation system 220 based on the measured thin film data 260. For example, the processor 210 is operable to receive the measured thin film data 260, analyze the measured thin film data 260, and to control the one or more process parameters 250 by determining whether an adjustment to the one or more process parameters 250 is necessary based on the measured thin film data, and further implementing the adjustment, if necessary, by instructing the thin film formation system 220 to utilize the adjustment.

According to one exemplary aspect of the present invention, the control is based on an analysis of the measured thin film data 260 and a target thin film data set 270. The target thin film data 270 comprises, for example, a set of measurement data collected from a previous measurement of a thin film which most closely approximates an ideal thin film in electrical or physical characteristics.

According to one exemplary aspect of the present invention, the processor 210 comprises an intelligent system such as, for example, a neural network or an algorithm. An intelligent system such as a neural network, for example, is trained to determine an adjustment of the one or more process parameters 250 based on an iterative analysis of numerous measured thin film data sets based on varying process parameter values. Alternatively, the neural network is trained, for example, to determine an adjustment to the one or more process parameters 250 based on an iterative analysis of numerous measured thin film data sets based on varying process parameter values and the target thin film data 270. According to another exemplary aspect of the present invention, the intelligent system comprises an algorithm designed to determine the adjustment of the one or more process parameters 250 based on the analysis of the measured thin film data 260. Alternatively, the analysis is also based on the target thin film data 270.

It is to be appreciated that various aspects of the present invention may employ intelligent system technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks) may also be employed.

The processor 210 alternatively comprises a look-up table 275 designed to associate an adjustment of the one or more process parameters 250 based on the measured thin film data 260 and, for example, the target thin film data 270. The adjustment of the one or more process parameters 250 is further implemented by the thin film formation system 220 for control of a subsequent thin film formation.

Figure 4:
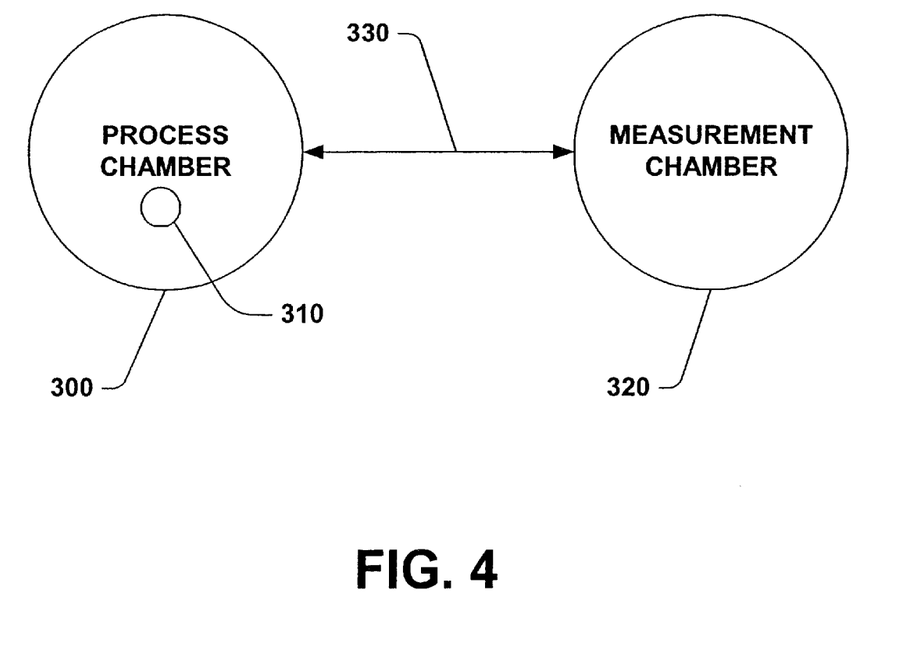
FIG. 4 is a diagram illustrating a two-chamber corona discharge measurement and feedback process control system according to the present invention.

According one exemplary aspect of the present invention, as illustrated in FIG. 4, a thin film is formed on a substrate 310 in a process chamber 300 via the thin film formation system 220 of FIG. 3, and measured in a measurement chamber 320 via the corona discharge measurement system 240 of FIG. 3. For example, a process chamber 300 such as a chemical vapor deposition (CVD) chamber or a rapid thermal processing (RTP) chamber is utilized to form the thin film using the one or more process parameters 250 of FIG. 3.

According to a further exemplary aspect of the present invention, the process chamber 300 of FIG. 4 is operably connected to the measurement chamber 320 via a substrate transfer system 330 such that the substrate 310 transfers between the process chamber 300 and the measurement chamber 320 in an environmentally isolated manner. For example, a pressure and temperature controlled, inert gas environment is utilized in the substrate transfer system 330 to eliminate possible contamination from sources which may cause further oxidation on the substrate 310 during transit between the process chamber 300 and the measurement chamber 320. In the above manner, for example, the process chamber 300 and the measurement chamber 320 are operably integrated together as a cluster tool and in-situ measurements of dielectric electrical thicknesses can be performed.

Alternatively, according to another exemplary aspect of the present invention, the thin film is formed via a thin film formation system 220 of FIG. 3 and measured via a corona discharge measurement system 240 in the same chamber.

In the prior art, a thin film is formed on a substrate in a formation chamber, and the substrate is manually transferred to a measurement chamber, whereby contamination of the thin film due to oxidation may occur causing a change in the electrical thickness of the thin film. For example, contamination may occur during transit if the substrate is not environmentally isolated. Such a change in the electrical thickness during transit can lead to an inaccurate representation of the thin film formation process when the thin film is measured. Further, since the formation chamber and measurement chamber are not operably connected via a processor, thin film measurement data from the measurement chamber is manually retrieved, and modifications to formation process parameters are not automated by a processor, thereby introducing an opportunity for human error, as well as increasing processing time.

Figure 5:
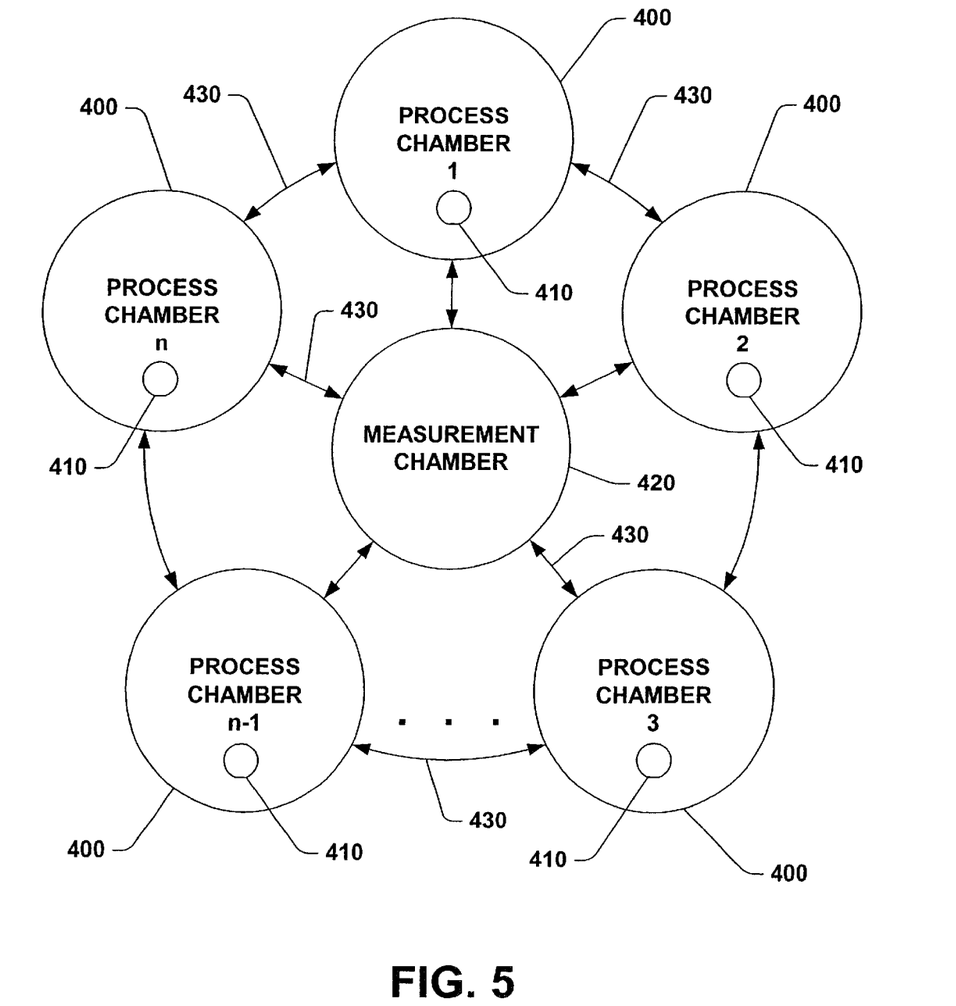
FIG. 5 is a diagram illustrating multiple process chambers operably connected to a single measurement chamber for corona discharge measurement and feedback process control according to the present invention.

According to a further exemplary aspect of the present invention, a thin film formation system 220 of FIG. 3 comprises a plurality of process chambers 400 as illustrated in FIG. 5 wherein a plurality of thin films are formed on one or more substrates 410 based on one or more process parameters 250 of FIG. 3 for each process chamber 400 of FIG. 5. The system further includes a measurement chamber 420 wherein the plurality of thin films formed in the chambers 400 are measured via the corona discharge measurement system 240 of FIG. 3. For example, one of the plurality of process chambers 400 of FIG. 5 is a chemical vapor deposition (CVD) chamber while another of the plurality of process chambers 400 is a rapid thermal processing (RTP) chamber. The plurality of process chambers 400, for example, are operably connected via a substrate transfer system 430 such that the one or more substrates 410 can be transferred between the plurality of process chambers 400 and between the chambers 400 and the measurement chamber 420 in an environmentally isolated manner. For example, a pressure and temperature controlled, inert gas environment is utilized in the substrate transfer system 430 to eliminate possible contamination from sources which may cause further oxidation on the one or more substrates 410 during transit between the plurality of process chambers 400 and between the chambers 400 and the measurement chamber 420. The measured thin film data 260 of FIG. 3 obtained from each thin film via the measurement system 240 is subsequently fed back to a central processor 210 or, for example, to individual processors associated with each process chamber 400 of FIG. 5 for analysis with, for example, target thin film data 270 of FIG. 3. The thin film formation system 220 subsequently controls the one or more process parameters 250 for the respective one of the plurality of process chambers 400 of FIG. 5 based on the analysis of the respective thin films. In the above manner, the plurality of process chambers 400 and the measurement chamber 420 are operably integrated together, for example, as a cluster tool and in-situ measurements of dielectric electrical thicknesses can be performed.

An exemplary system will be described hereafter with reference to FIGS. 3 and 5. A system 200 may contain two process chambers 400 and a measurement chamber 420 which are operably connected to one another via a substrate transfer system 430. A thin film is formed via the thin film formation system 220 on a substrate 220, 410 in a first process chamber 400 (e.g., a CVD chamber), based on process control parameters 250 for the first process chamber 400, and the substrate 220, 410 subsequently transfers via the substrate transfer system 430 to the measurement chamber 420 wherein the substrate 220, 410 is measured via a corona discharge measurement system 240. The measured thin film data 260 obtained for the thin film formed in the first process chamber 430 is analyzed by a processor 210, and an adjustment to the process parameters 250 for the first process chamber 400 is determined, for use in a subsequent thin film formation on a subsequent substrate. The substrate further transfers via the substrate transfer system 430 to a second process chamber 400 (e.g., an RTP chamber), wherein a subsequent thin film is formed on the substrate 220, 410 via the thin film formation system 220, based on process control parameters 250 for the second process chamber 400. The substrate 220, 410 then transfers via the substrate transfer system 430 to the measurement chamber 420 and again measured via the measurement system 240. The measured thin film data 260 obtained for the thin film formed in the second process chamber 400 is further analyzed by the processor 210, and an adjustment to the process parameters 250 for the second process chamber 400 is determined for use in a subsequent thin film formation. Alternatively, the measured thin film data 260 for the first process chamber 400 is used by the processor 210 to determine an adjustment to the second process chamber 400 before the thin film is formed on the substrate 220, 410 in the second process chamber 400.

Figure 6:
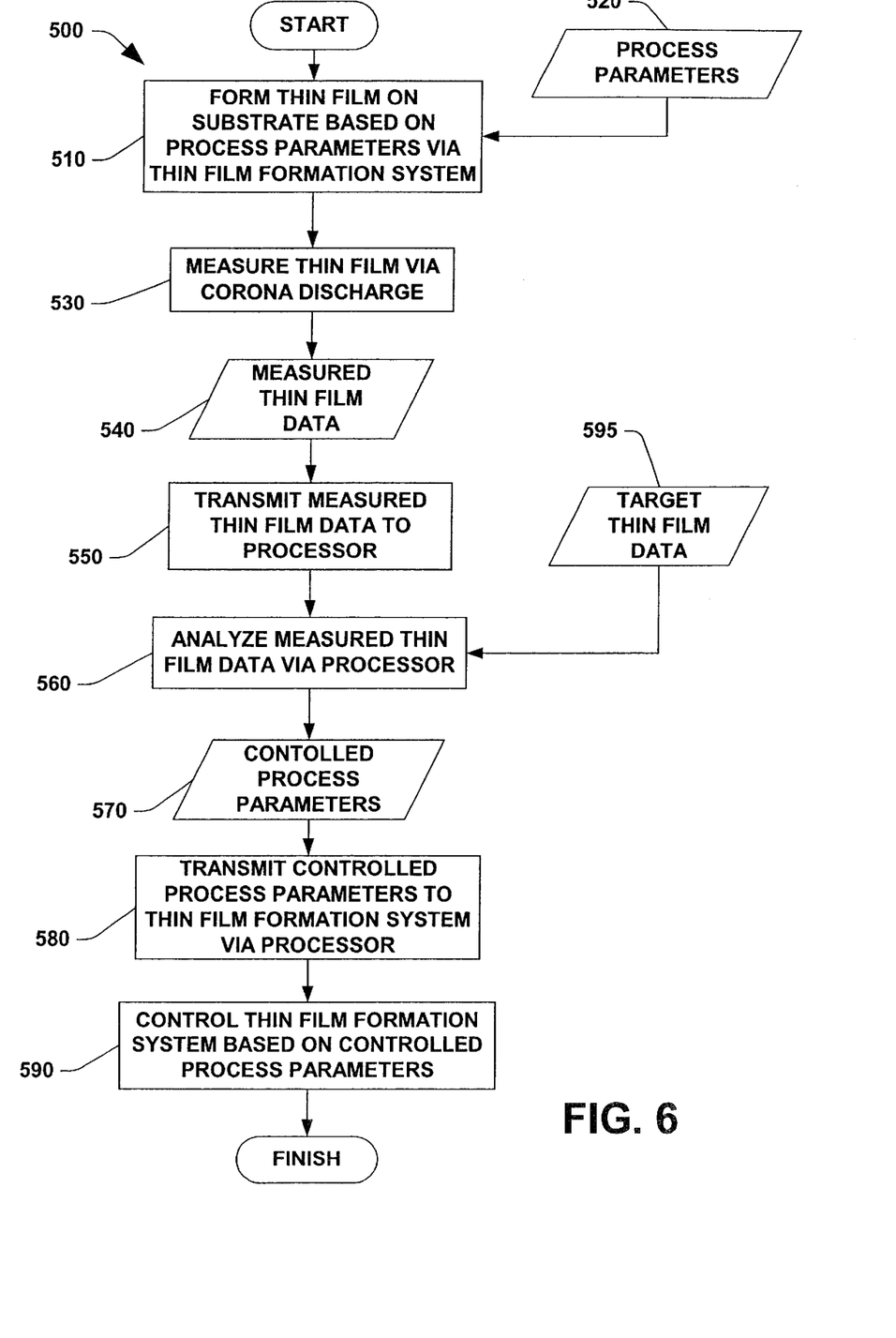
FIG. 6 is a flowchart illustrating the method of measuring an electrical thickness associated with a dielectric film and generating feedback control data associated therewith according to the present invention.

The present invention is also directed to a methodology for controlling a thin film formation process using a corona discharge technique. Referring now to FIG. 6, an exemplary method 500 is illustrated for controlling a thin film formation process. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the apparatus and systems illustrated and described herein as well as in association with other systems not illustrated.

The method 500 comprises forming a thin film (e.g., a gate oxide or tunnel oxide) on a substrate (e.g., silicon) at step 510 by means of a thin film formation system such as, for example, a system utilizing a CVD or thermal growth process, based on one or more process parameters 520. The gate oxide or tunnel oxide can be a thermally grown or deposited oxide, nitride, or stack of oxide and nitride. Furthermore, the gate oxide can comprise a high-K metal oxide such as $Al_2O_3$, $ZrO_2$, $HfO_2$, $Y_2O_3$, $La_2O_3$, silicates or aluminates of said oxides, or stacks of oxides and/or nitrides. Exemplary process parameters 520 include temperature, pressure, gas flow rate, and formation time, however other process parameters which can control a thin film formation process are also contemplated. The thin film is subsequently measured via a corona discharge technique at step 530, thereby defining measured thin film data 540. The measured thin film data 540 is transmitted to a processor at step 550, and analyzed by the processor at step 560 to control the one or more process parameters 520, thereby defining one or more controlled process parameters 570. The one or more controlled process parameters 570 are further transmitted back to the thin film formation system via the processor at step 580. The thin film formation system is then controlled, at step 590, based on the controlled process parameters 570.

According to one exemplary aspect of the present invention, the analysis of the measured thin film data 540 at step 560 further comprises analyzing a target thin film data set 595. The target thin film data 595 comprises, for example, a set of measurement data collected from a previous measurement of a thin film which most closely approximates an ideal thin film in electrical or physical characteristics.

According to one exemplary aspect of the present invention, the analysis at step 560 is performed by a processor which comprises an intelligent system. An intelligent system such as a neural network, for example, is trained to determine an adjustment of the one or more process parameters 520 based on an iterative analysis of numerous measured thin film data sets based on varying process parameter values. Alternatively, the neural network is trained, for example, to determine an adjustment to the one or more process parameters 520 based on an iterative analysis of numerous measured thin film data sets based on varying process parameter values and the target thin film data 595. According to another exemplary aspect of the present invention, the intelligent system comprises an algorithm designed to determine the adjustment of the one or more process parameters 520 based on the analysis of the measured thin film data 540. Alternatively, the analysis is also based on the target thin film data 595.

The analysis at step 560 alternatively comprises utilizing a look-up table designed to associate the one or more controlled process parameters 570 based on the measured thin film data 540 and, for example, the target thin film data 595. The one or more controlled process parameters 570 are further transmitted to the processor at step 580 and are implemented by the thin film formation system at step 590.

According to one exemplary aspect of the present invention, a thin film is formed, as illustrated in FIG. 4, on a substrate 310 at step 510 of FIG. 6 in a process chamber 300 of FIG. 4 and measured at step 530 of FIG. 6 in a measurement chamber 320 of FIG. 4. The substrate 310 transfers, for example, between the process chamber 300 and the measurement chamber 320 in an environmentally isolated manner via a substrate transfer system 330. Alternatively, a thin film is formed on a substrate 310 at step 510 of FIG. 6 and measured at step 530 in the same chamber.

Figure 7:
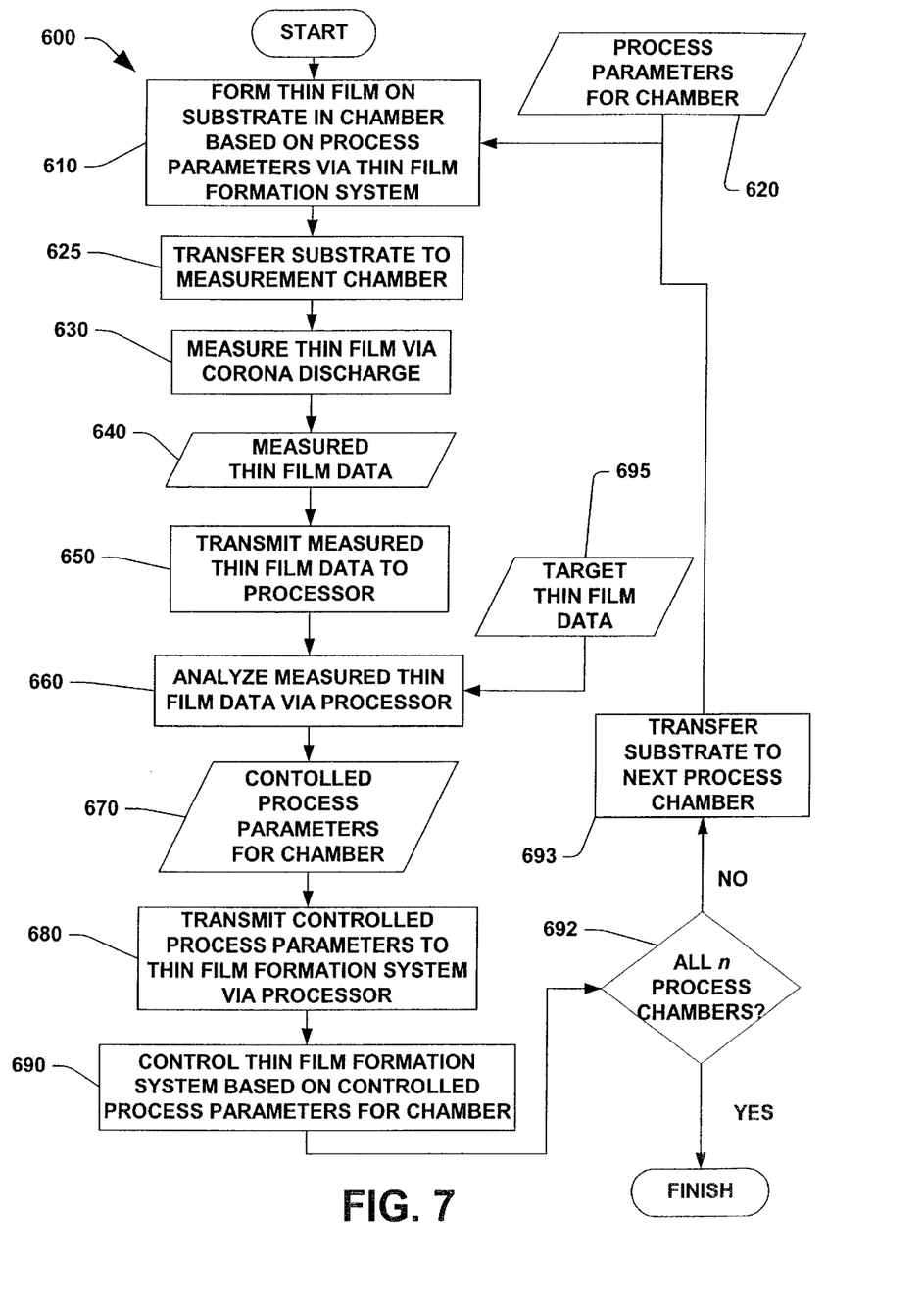
FIG. 7 is a flowchart illustrating the method of measuring an electrical thickness associated with a dielectric film formed in a plurality of chambers and generating feedback control data associated therewith according to the present invention.

The present invention is also directed to a methodology for controlling a thin film formation process using a corona discharge technique, wherein a plurality of thin films are formed in a plurality of process chambers, as illustrated in FIG. 5. An exemplary method is described hereafter with reference to FIGS. 5 and 7. According to the exemplary method, n process chambers form the plurality of thin films, wherein n is an integer greater than one. A thin film is formed on a substrate 410 via a thin film formation system at step 610 in a first process chamber 400, based on one or more process parameters 620 for the first process chamber 400. The substrate is subsequently transferred in an environmentally isolated manner to the measurement chamber 420 at step 625, wherein the thin film is measured at step 630, thereby defining measured thin film data 640. The measured thin film data 640 is further transmitted to a processor at step 650. An analysis of the measured thin film data 640 is performed by the processor at step 660, wherein the one or more process parameters 620 for the first process chamber 400 are controlled, thereby defining one or more controlled process parameters 670 for the first process chamber 400. The one or more controlled process parameters 670 for the first process chamber 400 are then transmitted to the thin film formation system via the processor at step 680 and are further implemented by the thin film formation system at step 690 for the first process chamber 400. A determination is made at step 692 as to whether a substrate from n process chambers have been measured. If a substrate from n process chambers have not been measured, the substrate 410 is transferred to the next process chamber 400, and steps 610 through 690 are performed until a thin film has been formed in n process chambers, thereby defining a stacked thin film on the substrate 410 comprising n thin film layers.

According to one exemplary aspect of the present invention, the analysis of the measured thin film data 640 for each process chamber 400 at step 660 further comprises analyzing a target thin film data set 695 for each process chamber 400. The target thin film data 695 comprises, for example, a set of measurement data collected from a measurement of a thin film from the process chamber 400 of FIG. 5 which most closely approximates an ideal thin film in electrical or physical characteristics.

According to another exemplary aspect of the present invention, a thin film formed in a first process chamber 400 is measured at step 630 concurrent to forming thin films on other substrates in the remaining process chambers 400 at step 610.

According to yet another exemplary aspect of the present invention, wherein the method 600 is performed as a calibration routine for a cluster tool on a periodic basis for regular production of stacked thin films on substrates. The method 600 can further be implemented in conjunction to the systems of FIG. 3 as described above, as will be apparent to one of ordinary skill in the art.

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature may be combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A system for controlling thin film formation, comprising:
   a thin film formation system operative to form a thin film on a substrate based on one or more process parameters;
   a corona discharge measurement system operative to measure one or more properties of the thin film, thereby defining measured thin film data; and
   a processor operatively coupled to the thin film formation system and the corona discharge measurement system, wherein the processor is adapted to receive the measured thin film data from the corona discharge measurement system, and use the measured thin film data to control the one or more process parameters utilized by the thin film formation system.

2. The system of claim 1, wherein the control is based on an analysis of the measured thin film data and a target thin film data set.

3. The system of claim 1, wherein the processor comprises an intelligent system.

4. The system of claim 3, wherein the intelligent system comprises a neural network trained to determine the control of the one or more process parameters based at least on an analysis of the measured thin film data.

5. The system of claim 3, wherein the intelligent system comprises an algorithm designed to determine the control of the one or more thin film process parameters based at least on an analysis of the measured thin film data.

6. The system of claim 1, wherein the processor comprises a look-up table designed to associate the control of the one or more thin film process parameters based at least on an analysis of the measured thin film data.

7. The system of claim 1, wherein the thin film is formed via the thin film formation system in a process chamber and measured via the corona discharge measurement system in a measurement chamber.

8. The system of claim 7, wherein the process chamber and the measurement chamber are operably connected via a substrate transfer system, wherein the substrate transfer system is operable to facilitate a transfer of the substrate between the process chamber and the measurement chamber in an environmentally isolated manner.

9. The system of claim 7, further comprising:
a plurality of process chambers wherein a thin film is formed on a substrate in each of the process chambers; and
a transfer system operable to transfer a substrate between at least one of the process chambers and the measurement chamber in an environmentally isolated manner.

10. The system of claim 9, wherein the processor is operable to control the one or more process parameters for each of the plurality of process chambers based at least on the analysis of the respective measured thin film data.

11. The system of claim 7, wherein the process chamber and the measurement chamber are the same chamber.

12. The system of claim 7, wherein the process chamber is a chemical vapor deposition chamber, atomic layer chemical vapor deposition system, metal organic chemical vapor deposition system, oxide deposition system, nitride deposition system, metal oxide deposition system, silicate deposition system, or aluminate deposition system.

13. The system of claim 7, wherein the process chamber is a rapid thermal processing chamber.

14. The system of claim 1, wherein the one or more process parameters is selected from the group consisting of temperature, pressure, gas flow rate, and formation time.

15. The system of claim 1, wherein the measured thin film data and the target thin film data set comprise thin film electrical thickness data ($T_{ox}$).

16. The system of claim 1, wherein the measured thin film data and the target thin film data set comprise thin interface charge density ($D_{it}$), total oxide charge ($Q_{tot}$), flat band voltage ($V_{fb}$), or onset of oxide tunneling ($E_{tunnel}$).

17. A method for controlling a thin film formation process comprising:
forming a thin film on a substrate via a thin film formation system based on one or more process parameters;
measuring the thin film using a corona discharge technique, thereby defining measured thin film data;
transmitting the measured thin film data to a processor;
analyzing the measured thin film data via the processor, thereby generating one or more controlled process parameters;
transmitting the one or more controlled process parameters to the thin film formation system via the processor; and
controlling the thin film formation system based on the one or more controlled process parameters.

18. The method of claim 17, wherein analyzing the measured thin film data further comprises analyzing a set of target thin film data via the processor.

19. The method of claim 17, wherein analyzing the measured thin film data further comprises utilizing an intelligent system.

20. The method of claim 19, wherein utilizing the intelligent system further comprises utilizing a neural network trained to generate the one or more controlled process parameters.

21. The method of claim 19, wherein utilizing the intelligent system further comprises utilizing an algorithm designed to generate the one or more controlled process parameters.

22. The method of claim 17, wherein analyzing the measured thin film data further comprises utilizing a look-up table designed to associate the one or more controlled process parameters.

23. The method of claim 17, wherein forming the thin film is performed in a process chamber, and wherein measuring the thin film is performed in a measurement chamber.

24. The method of claim 23, further comprising transferring the substrate between the process chamber and the measurement chamber in an environmentally isolated manner.

25. The method of claim 17, wherein forming the thin film and measuring the thin film is performed in the same chamber.

26. The method of claim 17, wherein forming the thin film is performed iusingchemical vapor deposition.

27. The method of claim 17, wherein forming the thin film is performed using rapid thermal processing.

28. The method of claim 17, wherein the thin film comprises a material selected from the group consisting of an oxide, a nitride, and a high-K dielectric material.

29. The method of claim 17, wherein the thin film is formed on a silicon substrate.

30. The method of claim 17, wherein the thin film is formed on another thin film, thereby defining a stacked thin film.

31. The method of claim 17, wherein the one or more process parameters are selected from a group consisting of temperature, pressure, gas flow rate, and deposition time.

32. The method of claim 17, wherein the measured thin film data and the target thin film data comprise electrical thickness data.

33. The method of claim 17, wherein the measured thin film data and the target thin film data comprise interface charge density data.

34. A method for controlling a stacked thin film formation process in n process chambers, wherein n is an integer greater than one, comprising:
(a) forming a thin film on a substrate in a process chamber via a thin film formation system based on one or more process parameters for the process chamber;
(b) transferring the substrate to a measurement chamber in an environmentally isolated manner;
(c) measuring the thin film using a corona discharge technique, thereby defining measured thin film data for the substrate;
(d) transmitting the measured thin film data to a processor;
(e) analyzing the measured thin film data via the processor, thereby generating one or more controlled process parameters for the process chamber;
(f) transmitting the one or more controlled process parameters for the process chamber to the thin film formation system via the processor;
(g) controlling the thin film formation system based on the one or more controlled process parameters for the process chamber;
(h) determining whether n process chambers have formed a thin film on the substrate and transferring the substrate to another process chamber in an environmentally isolated manner if n process chambers have not formed a thin film on the substrate; and (i) repeating steps (a) through (h) for n process chambers for the substrate, thereby defining a stacked thin film on the substrate comprising n thin film layers.

35. The method of claim 34, wherein analyzing the measured thin film data further comprises analyzing a set of target thin film data via the processor to control the one or more process parameters.

36. The method of claim 34, wherein analyzing the measured thin film data further comprises utilizing an intelligent system.

37. The method of claim 36, wherein utilizing the intelligent system further comprises utilizing a neural network trained to control the one or more process parameters.

38. The method of claim 36, wherein utilizing the intelligent system further comprises utilizing an algorithm designed to control the one or more process parameters.

39. The method of claim 34, wherein analyzing the measured thin film data further comprises utilizing a look-up table designed to associate the control of the one or more process parameters.

40. The method of claim 34, wherein steps (a) through (h) are performed for a calibration of a thin film formation process on a periodic basis, wherein the one or more controlled process parameters for each process chamber are utilized for the formation of stacked thin films for production substrates.

41. The method of claim 40, further comprising n substrates, wherein each process chamber contains a separate substrate.

42. The method of claim 41, further comprising measuring the thin film on a substrate in the measurement chamber concurrent to forming thin films on substrates in the remaining process chambers.

43. The method of claim 34, wherein forming the thin film is performed using chemical vapor deposition.

44. The method of claim 34, wherein forming the thin film is performed using rapid thermal processing.

45. The method of claim 34, wherein the thin film comprises a material selected from the group consisting of an oxide, a nitride, and a high-K dielectric material.

46. The method of claim 34, wherein the thin film is formed on a silicon substrate.

47. The method of claim 34, wherein the one or more process parameters are selected from a group consisting of temperature, pressure, gas flow rate, and deposition time.

48. The method of claim 34, wherein the measured thin film data and the target thin film data comprise electrical thickness data.

49. The method of claim 34, wherein the measured thin film data and the target thin film data comprise interface charge density data.

* * * * *

UNITED STATES PATENT AND TRADEMARK OFFICE
CERTIFICATE OF CORRECTION

PATENT NO. : 6,593,748 B1
DATED : July 15, 2003
INVENTOR(S) : Arvind Halliyal, Bhanwar Singh and Ramkumar Subramanian It is certified that error appears in the above-identified patent and that said Letters Patent is hereby corrected as shown below:

Column 12,
Line 23, please replace the word "iusingchemical" with the words -- using chemical --.

Signed and Sealed this

Second Day of September, 2003

JAMES E. ROGAN
*Director of the United States Patent and Trademark Office*